(12) United States Patent
Kajiyama

(10) Patent No.: US 11,851,748 B2
(45) Date of Patent: Dec. 26, 2023

(54) SPUTTERING TARGET AND METHOD FOR MANUFACTURING A SPUTTERING TARGET

(71) Applicant: JX Nippon Mining & Metals Corporation, Tokyo (JP)

(72) Inventor: Jun Kajiyama, Ibaraki (JP)

(73) Assignee: JX Metals Corporation, Tokyo (JP)

( * ) Notice: Subject to any disclaimer, the term of this patent is extended or adjusted under 35 U.S.C. 154(b) by 0 days.

(21) Appl. No.: 17/212,337

(22) Filed: Mar. 25, 2021

(65) Prior Publication Data

US 2021/0301389 A1     Sep. 30, 2021

(30) Foreign Application Priority Data

Mar. 31, 2020     (JP) .................................. 2020-064934

(51) Int. Cl.
*C23C 14/34* (2006.01)
(52) U.S. Cl.
CPC .............................. *C23C 14/3414* (2013.01)
(58) Field of Classification Search
CPC .............. C23C 14/3414; C23C 14/086; C23C 14/3407; C23C 14/08; H01J 37/3429; H01J 37/3491
See application file for complete search history.

(56) References Cited

U.S. PATENT DOCUMENTS

| 2012/0228132 A1 | 9/2012 | Koido | |
| 2013/0001077 A1* | 1/2013 | Park | H01J 37/32522 29/525.01 |
| 2015/0200082 A1* | 7/2015 | Fujimaru | H01J 37/3491 205/508 |

(Continued)

FOREIGN PATENT DOCUMENTS

| CN | 108706965 A | 10/2018 |
| CN | 109112490 A | 1/2019 |

(Continued)

OTHER PUBLICATIONS

JP-2017145459-A Translation (Year: 2017).*

(Continued)

*Primary Examiner* — Jennifer Wecker
*Assistant Examiner* — Patrick S Ott
(74) *Attorney, Agent, or Firm* — NIELDS, LEMACK & FRAME, LLC

(57) ABSTRACT

Provided a sputtering target and a method for manufacturing the sputtering target, in which a penetration of impurities into the target material during bonding is suppressed A sputtering target, wherein an intensity ratio (B/A) of a minimum reflection intensity B to a maximum reflection intensity A of a back surface wave of a target material as measured by a water immersion ultrasonic flaw detection inspection after bonding the target material is 0.70 or more, and wherein a water absorption rate of the target material determined by a relationship of a weight change rate ($100 \times (a-b)/b$) is 0.01% to 1.0%, where (a) is a weight after immersion as measured after immersing the target material in water for 10 hours and removing the water on a surface, and (b) is a dry weight of the target material before the immersion.

6 Claims, 1 Drawing Sheet

(56) References Cited

U.S. PATENT DOCUMENTS

| | | | | |
|---|---|---|---|---|
| 2016/0111264 A1* | 4/2016 | Tao | ............... | H01J 37/3491 |
| | | | | 204/298.13 |
| 2016/0326633 A1* | 11/2016 | Zhuang | ............... | C23C 14/3414 |
| 2018/0051371 A1* | 2/2018 | Shin | ............... | C23C 14/3414 |
| 2020/0384598 A1 | 12/2020 | Fujita et al. | | |

FOREIGN PATENT DOCUMENTS

| | | | | | |
|---|---|---|---|---|---|
| JP | 2002-53953 A | | 2/2002 | | |
| JP | 2002053953 A | * | 2/2002 | | |
| JP | 2004-132725 A | | 4/2004 | | |
| JP | 2004132725 A | * | 4/2004 | ......... | G01N 29/0609 |
| JP | 2010-121066 A | | 6/2010 | | |
| JP | 2017145459 A | * | 8/2017 | | |
| KR | 2012-0070607 A | | 6/2012 | | |
| KR | 2016-0085210 A | | 7/2016 | | |
| KR | 2019-0114751 A | | 10/2019 | | |
| TW | 317518 B | | 10/1997 | | |
| TW | 201923122 A | | 6/2019 | | |
| WO | 96/23085 A1 | | 8/1996 | | |

OTHER PUBLICATIONS

JP-2002053953-A Translation (Year: 2002).*
Korean communication, with English translation, dated Apr. 20, 2023 in corresponding Korean patent application No. 10-2021-0039345.

* cited by examiner

SPUTTERING TARGET AND METHOD FOR MANUFACTURING A SPUTTERING TARGET

FIELD OF THE INVENTION

The present invention relates to a sputtering target and a method for manufacturing the sputtering target.

BACKGROUND OF THE INVENTION

Masking is performed when a target material is bonded onto a base material to manufacture a sputtering target. For example, in Japanese Patent Application Laid-Open No. 2010-121066 (Patent Document 1), a bonding material is placed on a backing plate and a masking adhesive sheet having a fluororesin base material and a silicon adhesive layer provided on one side of the fluororesin base material is attached to the backing plate and the bonding material so as to surround an outer peripheral portion of the bonding material for masking the outer peripheral portion of the bonding material.

Next, after removing the attached masking adhesive sheet, the bonding material is heated to bond the target material to the backing plate. It is described that ITO sintered body is used as a material of the target material.

CITATION LIST

Patent Literatures

[Patent Literature 1] JP 2010-121066 A1

SUMMARY OF THE INVENTION

As exemplified in Patent Document 1, in a sputtering target having a target material of indium-tin oxide-based oxide (ITO) or indium oxide-zinc oxide-based oxide (IZO), the target has a property of not easily absorbing water and oil. Therefore, there might be no big problem for masking with a tape having heat resistance and adhesiveness.

However, for example, a target having a slightly lower relative density than ITO, IZO and the like, such as IGZO target composed of indium (In), gallium (Ga), zinc (Zn), and oxygen (O), or other ceramic-based targets such as $Al_2O_3$ and MgO has higher water absorption, and therefore, water absorption and oil absorption may occur via grain boundaries in the structure or microcracks in grains. Further, when bonding such a water-absorbing and oil-absorbing target, the tape component used for masking or the like may permeate into an inner side of the target material, and thus the target material may be deteriorated.

In view of the above problems, the present disclosure provides a sputtering target and a method for manufacturing the sputtering target, in which the penetration of impurities into the target material during bonding is suppressed.

In one aspect, the sputtering target according to an embodiment of the present invention is a sputtering target, wherein an intensity ratio (B/A) of a minimum reflection intensity B to a maximum reflection intensity A of a back surface wave of a target material as measured by a water immersion ultrasonic flaw detection inspection after bonding the target material is 0.70 or more, and wherein a water absorption rate of the target material determined by a relationship of a weight change rate (100×(a−b)/b) is 0.01% to 1.0%, where (a) is a weight after immersion as measured after immersing the target material in water for 10 hours and removing the water on a surface, and (b) is a dry weight of the target material before the immersion.

In another aspect, a method of manufacturing a sputtering target according to an embodiment of the present invention includes masking a target material with a non-adhesive tape when bonding the target material to a base material.

Still in one aspect, a method for manufacturing a sputtering target including laminating a target material on a base material; covering a side face and a surface of the target material with an inorganic covering material; masking the target material and the covering material with a non-adhesive tape; and bonding the target material and the base material by heating the masked target material.

According to the embodiment, it is possible to provide a sputtering target and a method for manufacturing the sputtering target, in which the penetration of impurities into the target material during bonding is suppressed.

DETAILED DESCRIPTION OF THE INVENTION

<Sputtering Target>

Figure 1:
FIG. 1 is a photograph showing an example of a flaw detection diagram by a water immersion ultrasonic flaw detection inspection of Example 1.

A sputtering target according to an embodiment of the present invention has an intensity ratio (B/A) of minimum reflection intensity B to maximum reflection intensity A of a back surface wave of a target material as measured by a water immersion ultrasonic flaw detection inspection after bonding the target material is 0.70 or more, and wherein a water absorption rate of the target material determined by a relationship of the weight change rate (100×(a−b)/b) is 0.01% to 1.0%, where (a) is a weight after immersion as measured after immersing the target material in water for 10 hours and removing the water, and (b) is a dry weight of the target material before the immersion.

(Composition)

The sputtering target according to the embodiment of the present invention may be preferably used for a target having the above-described characteristics as a material in which a tape component used for masking or the like permeates into inside of the target material during bonding and the target material may be deteriorated. Examples of such a sputtering target may include an oxide target material containing at least Ga and one or two types selected from the group consisting of In and Zn, a target material containing In, Ga, Zn and O, or a ceramic target material such as $Al_2O_3$, MgO, ZnO, and $SiO_2$, and the like.

Typically, the sputtering target according to the embodiment of the present invention may include In, Ga, and Zn, and the atom ratios for In, Ga, and Zn are:

$$0.20 \leq In/(In+Ga+Zn) \leq 0.70$$

$$0.20 \leq Ga/(In+Ga+Zn) \leq 0.70 \text{ and}$$

$$0.00 \leq Zn/(In+Ga+Zn) \leq 0.50.$$

Alternatively, the sputtering target according to the embodiment of the present invention may include In, Ga, and Zn, and the atom ratios for In, Ga, and Zn are:

$$0.32 \leq \text{In}/(\text{In}+\text{Ga}+\text{Zn}) \leq 0.36$$

$$0.32 \leq \text{Ga}/(\text{In}+\text{Ga}+\text{Zn}) \leq 0.36 \text{ and}$$

$$0.32 \leq \text{Zn}/(\text{In}+\text{Ga}+\text{Zn}) \leq 0.36.$$

The target material according to the embodiment of the present invention may contain, for example, Sn and/or Zr as the balance in addition to In, Ga, and Zn. The content may be, for example, 1000 mass ppm or less, and preferably, 500 mass ppm or less, respectively. In one embodiment, Sn may be contained in an amount of 400 mass ppm or less, and/or Zr may be contained in an amount of 200 mass ppm or less. The lower limits of Sn and Zr contents are not particularly limited, but may contain, for example, 0 mass ppm or more. More typically, 100 mass ppm or more of Zr and/or 300 mass ppm or more of Sn may be contained in the target.

The target material according to the embodiment of the present invention may contain at least one impurity component selected from the group consisting of C, Si, N, and Cl as an impurity component. This impurity component will be described in more detail in the manufacturing method as described later, but is an impurity component that can be mixed by using a conventional adhesive tape as a masking material when bonding (connecting) the target material and the base material.

Types and contents of the elements included in the target material may be specified by fluorescent X-ray analysis (XRF) or the like. In addition, elements other than In, Ga, and Zn may be specified by emission spectroscopic analysis (ICP).

(Ultrasonic Flaw Detection)

In the sputtering target according to the embodiment of the present invention, an intensity ratio (B/A) of a minimum reflection intensity B to a maximum reflection intensity A of a back surface wave of the target material by a water immersion ultrasonic flaw detection inspection after bonding the target material is 0.70 or more. It may be preferably 0.80 or more, and more preferably 0.90 or more. The reflection intensity may usually be obtained from a voltage value (mV) of the reflected wave signal received by a probe or the reflected wave intensity relative to the magnitude of the reflected wave on a surface of the target.

As for the water immersion ultrasonic flaw detector, FS LINE Hybrid manufactured by Hitachi Power Solutions, Ltd., and a probe of 2 MHz to 10 MHz may be used. The measurement is conducted by the steps of immersing the target material in pure water, pointing the prove vertically to the surface of the target material immersed in the water, scanning the surface of the target material horizontally and vertically, and measuring the reflection intensity of the back surface wave of the target material. The immersion time of the target material for the water immersion ultrasonic flaw detector may be a sufficient immersion time for performing the water immersion ultrasonic flaw inspection test, and varies depending on the target material, but is typically about 30 minutes. The maximum value of the measurement result is determined as the maximum reflection intensity A, and the minimum value is determined as the minimum reflection intensity B. However, when determining the maximum reflection intensity A and the minimum reflection intensity B, a part where an adhesive failure is occurred and a part where an abnormal reflected wave is detected due to the adhesion of air bubbles during flaw detection are excluded, and the measurement is performed from a part where the adhesion is good.

In obtaining the maximum reflection intensity A and the minimum reflection intensity B, it is preferable to use a flaw detection diagram in terms of measurement efficiency. In the flaw detection diagram, the magnitude of the reflection intensity is visualized by shade and color difference of the flaw detection map. In the obtained flaw detection map, the maximum reflection intensity A and the minimum reflection intensity B are measured by applying a prove onto a position with the highest reflection intensity (eg, the position where color is displayed in the whitest in the flow detection diagram) and a position with the lowest reflection intensity (eg, the position where color is displayed in the blackest in the flow detection diagram). When the reflection intensity is uniform over the entire flaw detection diagram, the reflection intensity is randomly measured at four locations, excluding a part where an adhesive failure is occurred and a part where an abnormal reflected wave is detected due to the adhesion of air bubbles during flaw detection, and the maximum reflection intensity A and the minimum reflection intensity B at the four locations are calculated.

According to the sputtering target according to the embodiment of the present invention, since adhesion and residue of the impurity component from the masking material to the target material in the bonding process are suppressed by using the manufacturing method as described later, the local increase in the reflection intensity due to the adhesion of impurities to the target material is suppressed and a uniform reflection intensity can be obtained in the plane.

(Water Absorption Rate)

The sputtering target according to the embodiment of the present invention includes a target material having a water absorption rate X of 0.01 wt % to 1.0 wt %, more typically 0.01 wt % to 0.2 wt %, and more typically 0.01 wt % to 0.1 wt %. Here, the "water absorption rate X" refers to a relationship of a weight change rate and calculated by [100×(a−b)/b], where "b" is determined as a dry weight (original weight) of the target material and "a" is determined as a weight of the target material measured by immersing the target material in the water, and after the immersion is completed, blowing water adhered to the surface is removed by air blowing. For the immersion of the target material in pure water, the time required for the water absorption state of the pure water to reach a parallel state in the target material is defined as the immersion completion time, which is about 10 hours.

(Impurity Component Distribution)

In the sputtering target according to the embodiment of the present invention, the target material after bonding contains at least one impurity component selected from the group consisting of C, Si, N, and Cl and a maximum impurity component value (Cmax) is 30 mass ppm or less for C and 5.0 mass ppm or less for Si, N, and Cl, respectively.

The maximum component value (Cmax) of each impurity component is sampled in a size of approximately 10 mm×10 mm×10 mm from a location where the maximum reflection intensity A is obtained in the target material subjected to ultrasonic flaw detection so that the target surface is included and cut in the target thickness direction. The sample is measured by Inductively Coupled Plasma (ICP) analysis, preferably by Glow Discharge Mass Spectrometry (GDMS).

(Relative Density)

Although it is not related to the above characteristics, a relative density of the target material may be preferably 90% or more, more preferably 95% or more, further preferably 97% or more, in terms of quality improvement in consideration of generation of nodules and particles. The relative density is expressed by relative density=(measured density/theoretical density)×100(%) according to the measured density and the theoretical density. The theoretical density is a density value calculated from the theoretical density of oxides of the elements excluding oxygen in each constituent element of the sintered body.

According to the sputtering target according to the embodiment of the present invention, it is possible to obtain a sputtering target in which impurity components are less contaminated in the target material during bonding.

<Method of Manufacturing Sputtering Target>

A method of manufacturing a sputtering target according to an embodiment of the present invention includes masking a target material with a non-adhesive tape when bonding the target material to a base material. More typically, the method includes laminating a target material on a base material; covering a side face and a surface of the target material with an inorganic covering material; masking the target material and the covering material with a non-adhesive tape; and bonding the target material and the base material by heating the masked target material.

By masking the target material with the non-adhesive tape, the adhesion and residue of impurity components such as Si and Cl derived from silicone-based adhesives and acrylic-based adhesives that have been conventionally used as masking materials can be prevented from adhering to and remaining on the target material. Accordingly, it is possible to suppress contamination of the target material during bonding.

More specifically, the surface of the target is firstly covered with an inorganic covering material. This is to prevent a molten filler material used during bonding from adhering to the surface of the target material. Next, an outer peripheral surface (side face) of the target material and the covering material covering the surface of the target material are covered with a non-adhesive tape to mask the outer peripheral surface of the target material.

It is preferable to include at least one of a glass cloth and an aluminum foil as the inorganic covering material. As the glass cloth, it is preferable to use a glass cloth that is inorganic and has air-permeability, such as a glass cloth sheet made of polyimide. As the non-adhesive tape, a so-called sealing tape or pipe seal, which is made of a fluororesin as a base material and has a heat resistance of up to about 250° C., without using an adhesive material may be preferable. If the thickness of the tape is too thick at the time of bonding, it becomes difficult to adjust the gap between the pieces. Therefore, it is preferable to have a thickness of 0.05 mm to 0.15 mm. Specific examples thereof may include a fluororesin product (Pipe Seal No. 95) manufactured by Nitto Denko KK.

Next, the masked target material is heated at, for example, 160° C. to 200° C., and the base material (backing plate) and the target material are joined to obtain a sputtering target according to the embodiment of the present invention.

According to the sputtering target according to the embodiment of the present invention, by masking the target material with the non-adhesive tape, it is possible to prevent components of the pressure-sensitive adhesive from adhering to the target material. As a result, it is possible to produce a sputtering target having a low impurity concentration and suppressing deterioration of the target material due to intrusion of components constituting the masking material.

EXAMPLES

Examples of the present invention are shown below together with Comparative Examples. However, these Examples are provided for better understanding of the present invention and its advantages, and are not intended to limit the present invention.

In Examples 1 and 2, a plate-shaped target material (IGZO target) having a composition of In:Ga:Zn=1:1:1, a relative density of 96%, a size of a length of 508 mm, a width of 127 mm, and a thickness of 6 mm is laminated on a plate-shaped base material having a length of 541 mm, a width of 160 mm, and a thickness of 8 mm via a bonding layer made of In metal and having a thickness of 5 mm. In Example 3, IGO target was laminated on the base material as described above. The side face of the target material was masked with the tape as shown in Table 1, and the surface of the target material was masked with the covering material as shown in Table 1. The laminate of the base material and the target material after masking was bonded to the base material and the target material while heating at 160 to 200° C., and then cooled to obtain a sputtering target. The cooled sputtering target was subjected to an ultrasonic flaw detection inspection using an ultrasonic flaw detector (FS LINE Hybrid manufactured by Hitachi Power Solutions, Ltd.). In the ultrasonic flaw detection, the sputtering target after bonding is immersed in a water tank (water temperature at 10° C.) containing water in the device for 30 minutes, and a 5 MHz ultrasonic flaw detector (probe) is used as a ultrasonic flaw detector (probe) of the sputtering target. The reflection intensity at predetermined positions of the target material were measured by scanning along the length direction and the width direction. Here, the intensity ratio of the minimum reflection intensity B to the maximum reflection intensity A of the back surface wave of the target material (reflection intensity ratio (B/A)) was measured by comparing the voltage value (mV) of the signal of the reflected wave received by the probe. However, the same value may also be obtained by measuring the relative intensity ratio of the reflected wave to the magnitude of the reflected wave on the target surface. The flaw detection result of Example 1 is shown in FIG. 1 as a flaw detection diagram representing Examples 1 to 3. As described above, the water absorption rates of the target materials of Examples 1 to 3 and Comparative Examples 1 to 5 were measured based on the relationship of the weight change rates of the target materials before and after the target material was immersed for 10 hours.

Figure 2:
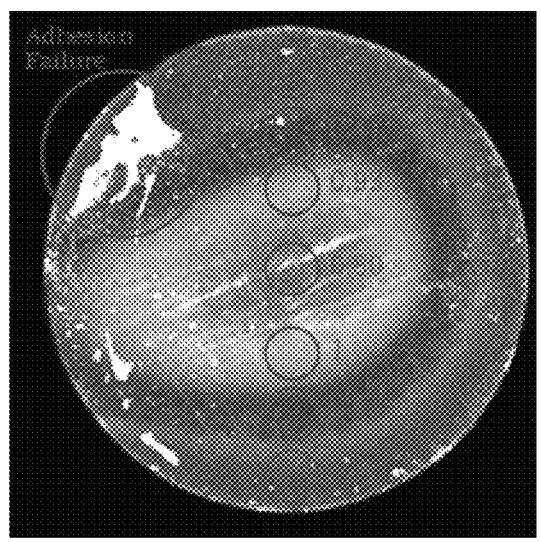
FIG. 2 is a photograph showing an example of a flaw detection diagram by a water immersion ultrasonic flaw detection inspection of Comparative Example 1.

In Comparative Examples 1, 3 to 5, a circular IGZO target material having a diameter of 445 mm and a thickness of 5 mm was laminated on a round base material having a diameter of 523 mm and a thickness of 22 mm via a bonding layer of In metal having a thickness of 0.5 mm. In Comparative Example 2, the same IGO target as disclosed in Example 3 was laminated, and the reflection intensity was measured by the same procedure as in Examples 1 to 3 except that the outer surface of the target material was masked with the tape or film as shown in Table 1. The flaw detection results of Comparative Example 1 is shown in FIG. 2 as a flaw detection diagram representing Comparative Examples 1 to 5.

| | Tape type | Tape Adhesive | Covering Material | Sample | Water Absorption Rate | Reflection Intensity Ratio | Impurity analysis | | | |
|---|---|---|---|---|---|---|---|---|---|---|
| | | | | | | | C | Si | N | Cl |
| Example 1 | Pipe Seal | None | Glass Cloth | IGZO (1:1:1) | 0.09 | 0.83 | 20 | <5 | <5 | <5 |
| Example 2 | Pipe Seal | None | Aluminum Foil | IGZO (1:1:1) | 0.10 | 0.78 | 30 | <5 | <5 | <5 |
| Example 3 | Seal Tape | None | Aluminum Foil | IGO($Ga_2O_3$ = 40%) | 0.05 | 0.86 | 20 | <5 | <5 | <5 |
| Comparative Example 1 | Kapton Tape | Silicon-based | Aluminum Foil | IGZO (1:1:1) | 0.10 | 0.47 | 90 | 15 | <5 | <5 |
| Comparative Example 2 | Kapton Tape | Silicon-based | Aluminum Foil | IGO($Ga_2O_3$ = 40%) | 0.05 | 0.21 | 60 | 11 | <5 | <5 |
| Comparative Example 3 | Vinyl Tpe | Acrylic-besed | Aluminum Foil | IGZO (1:1:1) | 0.08 | 0.22 | 700 | 13 | <5 | 58 |
| Comparative Example 4 | Masking Tape For Plating | Acrylic-based | Aluminum Foil | IGZO (1:1:1) | 0.09 | 0.33 | 60 | <5 | <5 | <5 |
| Comparative Example 5 | Thermoactive Film | Nitrile-based | Aluminum Foil | IGZO (1:1:1) | 0.09 | 0.22 | 120 | <5 | 28 | <5 |

In Examples 1, 2 and 3, a pipe seal or a sealing tape, which is a non-adhesive tape having no adhesive layer, was used as the masking material for the outer peripheral portion of the target material, so that impurities were less mixed into the target material and a flaw detection diagram having uniform reflection intensity was obtained. A flaw detection diagram having uniform reflection intensity was obtained as shown in the flaw detection diagram of Example 1 (FIG. 1). Further, sampling for elemental analysis was conducted from the site where the maximum reflection intensity A was obtained and GDMS analysis was conducted. C was 30 mass ppm or less, and the three elements Si, N, and Cl were also less than 5 mass ppm. It can be confirmed that the tape is not affected by the components of the tape during bonding.

On the other hand, in Comparative Examples 1 to 5, masking for bonding was performed by using various tapes using an organic adhesive material, and as shown in the flaw detection diagram (FIG. 2) of Comparative Example 1, a flaw detection map with different reflection intensities was obtained depending on the target site. Similar to the above, sampling was performed from the site where the maximum reflection intensity A was obtained and elemental analysis was performed by the GDMS, the adhesive material components of the tape and the base material components were detected from the target. In Comparative Examples 1 to 5, several types of tapes having typical adhesive materials were selected and verified, but the types of tapes and adhesive materials are not limited to these and may penetrate the target. Some tapes and components are considered to have an adverse effect on target flaw detection as shown in Comparative Examples 1 to 5.

Figure 3:
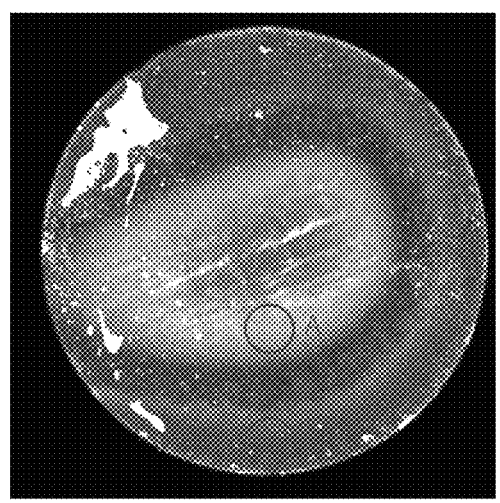
FIG. 3 is a photograph showing an example of an impurity concentration measurement point of Comparative Example 1

FIG. 3 shows examples of the positions of the locations where the maximum reflection intensity A was obtained, the locations where the minimum reflection intensity B was obtained, and the locations C where the normal reflection intensity was obtained in the flaw detection diagram (FIG. 2) as shown in Comparative Example 1.

While the present disclosure has been described in accordance with the embodiments and examples described above, the descriptions and drawings that form part of this disclosure should not be understood to limit the invention. That is, the present invention is not limited to the respective embodiments and examples, and the constituent elements may be modified and embodied without departing from the scope thereof.

What is claimed is:

1. A sputtering target comprising a target material bonded onto a base material, the target material containing In, Ga, Zn and O,
wherein an intensity ratio (B/A) of minimum reflection intensity B to maximum reflection intensity A of a back surface wave of the target material as measured by a water immersion ultrasonic flaw detection inspection after bonding the target material is 0.70 or more, and
wherein a water absorption rate of the target material determined by a relationship of the weight change rate (100×(a−b)/b) is 0.01% to 1.0%, where (a) is a weight after immersion as measured after immersing the target material in water for 10 hours and removing the water, and (b) is a dry weight of the target material before the immersion.

2. The sputtering target according to claim 1, wherein the target material comprises In, Ga, and Zn, wherein atom ratios for In, Ga, and Zn are:

0.20≤In/(In+Ga+Zn)≤0.70

0.20≤Ga/(In+Ga+Zn)≤0.70 and 0.00<Zn/(In+Ga+Zn)≤0.50

3. The sputtering target according to claim 1, wherein the target material comprises In, Ga, and Zn, wherein atom ratios for In, Ga, and Zn are:

0.32≤In/(In+Ga+Zn)≤0.36

0.32≤Ga/(In+Ga+Zn)≤0.36 and 0.32≤Zn/(In+Ga+Zn)≤0.36.

4. The sputtering target according to claim 1, wherein the target material comprises at least one impurity component selected from the group consisting of C, Si, N, and Cl.

5. The sputtering target according to claim 4, wherein a maximum impurity component value (Cmax) is 30 mass ppm or less for C and 5.0 mass ppm or less for Si, N, and Cl.

6. The sputtering target according to claim 1, wherein a relative density is 90% or more.

* * * * *